(12) United States Patent
Michel

(10) Patent No.: US 6,320,528 B1
(45) Date of Patent: Nov. 20, 2001

(54) BUILT-IN SELF TEST FOR INTEGRATED DIGITAL-TO-ANALOG CONVERTERS

(75) Inventor: Jean-Yves Michel, Vallauris (FR)

(73) Assignee: Koninklijke Philips Electronics NV (NL)

( * ) Notice: Subject to any disclaimer, the term of this patent is extended or adjusted under 35 U.S.C. 154(b) by 0 days.

(21) Appl. No.: 09/419,465

(22) Filed: Oct. 15, 1999

(51) Int. Cl.⁷ .................................................. H03M 1/66
(52) U.S. Cl. ........................ 341/144; 341/120; 341/145
(58) Field of Search .................................. 341/144, 145, 341/117, 141, 142, 118, 119, 120, 121, 147, 146; 358/455; 235/150.52; 307/494

(56) References Cited

U.S. PATENT DOCUMENTS

| | | | |
|---|---|---|---|
| 3,573,448 | * 4/1971 | Valentine | 340/347 |
| 3,603,772 | 9/1971 | Paine | 235/153 |
| 4,281,355 | 7/1981 | Wada et al. | 360/32 |
| 4,733,167 | 3/1988 | Tamamura | 324/73 R |
| 5,101,206 | 3/1992 | Riedel | 341/156 |
| 5,130,578 | * 7/1992 | Stone et al. | 307/494 |
| 5,132,685 | 7/1992 | DeWitt et al. | 341/120 |
| 5,164,726 | 11/1992 | Bernstein et al. | 341/120 |
| 5,272,544 | * 12/1993 | Sakai et al. | 358/445 |
| 5,332,996 | 7/1994 | Guzinski et al. | 341/120 |
| 5,659,312 | 8/1997 | Sunter et al. | 341/120 |
| 5,771,012 | 6/1998 | Shu et al. | 341/118 |
| 5,854,598 | 12/1998 | De Vries et al. | 341/120 |
| 5,861,826 | 1/1999 | Shu et al. | 341/120 |
| 5,909,186 | 6/1999 | Göhringer | 341/120 |
| 5,973,631 | 10/1999 | McMullen et al. | 341/144 |
| 6,169,505 | * 1/2001 | Nishimura et al. | 341/141 |

FOREIGN PATENT DOCUMENTS

| | | |
|---|---|---|
| 1123530 | 6/1987 | (JP) . |
| 11-017541 | 1/1999 | (JP) . |

OTHER PUBLICATIONS

Arabi, K. et al. "On Chip Testing Data converters Using Static Parameters", *IEEE Transactions on Very Large Scale Integration (VLSI) Systems*, vol. 6, No. 3, New York, IEEE Inc., (Sep. 1998), pp. 409–419.

* cited by examiner

*Primary Examiner*—Brian Young
*Assistant Examiner*—John Nguyen
(74) *Attorney, Agent, or Firm*—Wood, Herron & Evans, L.L.P.

(57) ABSTRACT

A circuit arrangement and method for testing the differential non-linearity (DNL) of a digital-to-analog converter (DAC) determines whether the digital-to-analog converter has an analog output that is monotonic, and thus the DAC is functional The design is appropriate for being implemented on an integrated circuit containing a digital-to-analog converter, creating an efficient self-test circuit arrangement. A counter generates a monotonic sequence of digital input codes for a digital input of the digital-to-analog converter. A monotonicity comparator, such as a one-stage or multistage sample and hold circuit arrangement, detects any non-monotonic transition in the analog output of the digital-to-analog converter, generating an error signal as an output. An output switch, such as a digital flip-flop, may be set by the error signal, for monitoring by other devices. A clock signal synchronizes the counter and the monotonicity comparator. A reset signal may be included to reset the counter to the first digital input code in the sequence, The reset may also reset the output switch.

19 Claims, 2 Drawing Sheets

BUILT-IN SELF TEST FOR INTEGRATED DIGITAL-TO-ANALOG CONVERTERS

FIELD OF THE INVENTION

The invention is generally related to integrated circuit device design and architecture, and in particular, to functionally testing a digital-to-analog converter (DAC).

BACKGROUND OF THE INVENTION

A digital-to-analog converter is essential in presenting the discrete (usually binary) signal results of digital computation, storage, or transmission, into the form of the value or magnitude of some characteristic of the signal for graphical display, audio sound reproduction, or the control of devices that operate with continuously varying quantities. Often, a digital-to-analog converter has multiple electrical inputs representing a parallel binary number and an output in the form of a voltage or current The analog output of a digital-to-analog converter is generally proportional to the product of the digital input value and a reference value. In many applications, the reference is fixed, and the output bears a fixed proportion to the digital input. Thus, the relationship of the analog output is generally linear. In other applications, the reference, as well as the digital input, can vary. A digital-to-analog converter that is used in these applications is thus often referred to as a multiplying digital-to-analog converter.

Digital-to-analog converters in the past tended to be lumped-component electronic devices produced individually and individually calibrated and tested. The readily accessible construction of such digital-to-analog converters allowed comprehensive external test equipment, often general purpose laboratory equipment, to be connected to various test points. The calibration and testing generally relied upon a skilled human operator to vary the necessary digital inputs to the digital-to-analog converter and to monitor the analog outputs. Consequently, the manufacturing costs were relatively high given the expense in test equipment and labor costs for testing Digital-to-analog converters were later constructed using integrated circuit technology, such as fabricating a quad DAC dual in-line package (DIP) integrated circuit. Economic savings were realized by including most or all of the necessary electronic circuits for each digital-to-analog converter in a single semiconductor integrated circuit. Testing remained feasible since each digital-to-analog converter included external pins as test points for the digital input and analog output. Moreover, programmable external test equipment became available to generate the digital inputs and to monitor the analog outputs.

However, some applications of digital-to-analog converters in more recent devices are difficult to test. For example, digital-to-analog converters are used in the design of analog-to-digital converters that employ feedback techniques, such as successive-approximation and counter-comparator types. In such applications, the digital-to-analog converter may not necessarily appear as a separate identifiable entity. Moreover, the numbers of digital-to-analog converters incorporated into a single semiconductor integrated circuit may be large. Consequently, adding external connections for external test equipment is often impractical. Even if external connections would be feasible in some applications, an economic cost is incurred in using external test equipment, due to the cost of the equipment itself as well as delays incurred in the production line due to the testing.

Consequently, fabricating testing capability into each integrated circuit device that has a digital-to-analog converter would be beneficial. Unfortunately, known external testing equipment generally relies on comprehensive and complex testing algorithms. Integrated circuit designs replicating such comprehensive testing would undermine, if not render completely impractical, the goal of testing digital-to-analog converters in a more economic fashion. Moreover, in some applications, comprehensive testing of a digital-to-analog converter is not warranted. For example, the design and/or manufacturing process may tend to have very little variation in performance of the digital-to-analog converter. As another example, the digital-to-analog converter is used in an application requiring modest performance and only a basic functionality test is required.

Therefore, a significant need exists in the art for a simplified approach to functionality testing of digital-to-analog converters, and in particular, an approach that may be suitable for integration into a semiconductor integrated circuit containing one or more digital-to-analog converters.

SUMMARY OF THE INVENTION

The invention addresses these and other problems associated with the prior art by providing a circuit arrangement and method that tests a digital-to-analog converter for functionality by detecting a non-monotonic condition. A non-monotonic condition for a digital-to-analog converter occurs whenever the change in analog output between two digital inputs in a montonic sequence has an opposite polarity to that expected. A monotonic sequence has a set of members that either consistently increase or decrease, but not both, in relative value.

Monotonic analog output responsive to a monotonic digital input characterizes proper operation of most digital-to-analog converters. As such, it has been found that testing for monotonicity adequately verifies performance in most instances for digital-to-analog converters.

Functionally testing for monotonicity allows for simpler test circuit arrangements than typical of complex, comprehensive external test equipment. Thus, such test circuit arrangements may be incorporated into an integrated circuit device. Therefore, some applications of such integrated circuit test circuit arrangements are suitable for built-in self testing, which can save time during manufacturing.

In one aspect consistent with the present invention, a test circuit arrangement for testing a digital-to-analog converter includes a digital code generator and a monotonicity comparator. The digital code generator produces first and second digital input codes that are operatively coupled to a digital input of the digital-to-analog converter. The first digital input code precedes the second digital input code in a monotonic sequence. The monotonicity comparator receives an analog output from the digital-to-analog converter and is configured to compare a second analog signal output by the digital-to-analog converter responsive to a second digital input code with a first analog signal output by the digital-to-analog converter responsive to the first digital input code. An indication is given in response to a non-monotonic transition found during the comparison.

In another aspect consistent with the invention, an integrated circuit includes a digital-to-analog converter, having a digital input and an analog output, and a self-test circuit arrangement to test the digital-to-analog converter. The self-test circuit arrangement includes a digital code generator configured to generate a monotonic sequence of digital input codes that includes first and second digital input codes. The first digital input code precedes the second digital input code in the monotonic sequence. The digital code generator is adapted to be operably coupled to the digital input of the digital-to-analog converter. The self-test circuit arrangement also includes a monotonicity comparator adapted to be operably coupled to the analog output of the digital-to-analog converter. The monotonicity comparator is configured to compare a second analog signal output by the digital-to-analog converter in response to the second digital input code with a first analog signal output by the digital-to-analog converter in response to the first digital input code, and to indicate a non-monotonic transition between the first analog signal and the second analog signal.

In yet another aspect consistent with the invention, a method for testing a digital-to-analog converter having a digital input and an analog input and included in an integrated circuit includes the step of generating a monotonic sequence of digital input codes that includes first and second digital input codes, the first digital input code preceding the second digital input code in the monotonic sequence. The digital code generator is adapted to be operably coupled to the digital input of the digital-to-analog converter. The method includes comparing a second analog signal output by the digital-to-analog converter responsive to the second digital input code with a first analog signal output by the digital-to-analog converter responsive to the first digital input code, and in response thereto, indicating a non-monotonic transition between the first analog signal and the second analog signal.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there are described exemplary embodiments of the invention.

DETAILED DESCRIPTION

Figure 1:
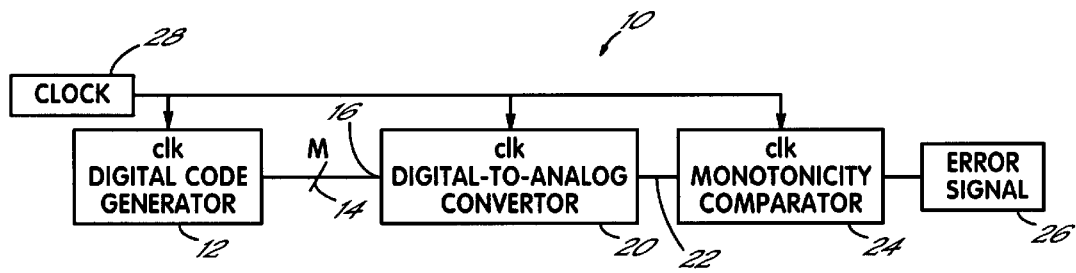
FIG. 1 is a block diagram of a first self-test circuit arrangement consistent with the invention.

A digital-to-analog converter is typically identified by its number of bits of resolution (M). For example, an 8-bit digital-to-analog converter (DAC) receives a digital input code of 8-bits in length. Consequently, the number of digital input codes that can be received is $2^M = 2^8 = 256$. The range would thus be from 0 to $(2^M - 1)$ or 255 The digital-to-analog converter typically generates an output in proportion to the product of a reference voltage and the digital input code. For simplicity, the discussion below assumes a normalized positive voltage reference, although those skilled in the art will appreciate the minor modifications necessary for changes such as a negative voltage reference or those with varying gain.

It is desirable in most digital-to-analog converter applications to have a monotonic output. In the context of a digital-to-analog converter, this means for each digital value that can be provided to a digital input of the DAC, a monotonic relationship exists with an analog value at an analog output of the DAC. To perform functionality testing consistent with the invention, therefore, the analog output is monitored in response to the application of a monotone sequence of numbers representative of all or a portion of the input range of the DAC. As used herein, a monotonic sequence has a set of members that either consistently increase or decrease, but not both, in relative value. Thus, each member of a monotone increasing sequence is greater than or equal to its preceding member, and each member of a monotone decreasing sequence is less than or equal to its preceding member. A monotone sequence can have consecutive members (e.g., 3, 4, 5, 6, 7) and non-consecutive members (e.g., 3, 5, 7, 8, 11).

Ideally, the step in the analog output between digital input codes differing by one least significant bit (LSB) would be $1/(2^M - 1)$ of the analog output range. Thus, the differential non-linearity (DNL) of a monotone increasing digital-to-analog converter can be determined by the following equation:

$$DNL(N) = \frac{DAC(N) - DAC(N-1)}{\frac{DAC(2^M - 1)DAC(0)}{2^M - 1}} - 1$$

where DAC(N) indicates the analog output at a digital input code N. If the digital-to-analog converter is ideal, the DNL(N)=0 for every value of N in the range $1.2^M - 1$. If DNL(N) <-1 LSB, then DAC(N)<DAC(N-1), and the digital-to-analog converter is non-monotonic for a positive voltage reference.

Embodiments of the invention utilize a monotonicity comparator to provide functionality testing of the digital-to-analog converter by requiring that the analog output for a digital input code N should always be higher than for the preceding digital input code N-1.

In the discussion below, in response to detecting a non-monotonic transition in the analog output of a digital-to-analog converter, an error signal is generated as an output. Specifically, an error signal remains high until a non-monotonic transition has been found. However, it will be apparent to those skilled in the art that such an error signal in response to detecting a non-monotonic transition includes various types of indications, both by the presence or absence of a signal, that all transitions were found to be monotonic, that one or more transitions were found to be non-monotonic, and/or that testing is incomplete.

Referring to FIG. 1, a first self-test circuit arrangement 10 consistent with the invention is depicted in block diagram form including a digital code generator 12 providing an M-bit digital input code 14 to the digital input 16 of a digital-to-analog converter 20 being tested. The digital-to-analog converter 20 converts each digital input code 14 to an analog output 22 which is tested for monotonicity by a monotonicity comparator 24, which in turn generates an error signal 26 in response to a non-monotonic transition. The self-test circuit arrangement 10 is synchronized by a clock 28 operatively coupled to the digital code generator 12, digital-to-analog converter 20 and monotonicity comparator 24, although those skilled in the art would recognize other ways to synchronize operation.

To test the digital-to-analog converter 20, the digital code generator 12 generates a monotonic sequence of digital input codes 14, with the digital-to-analog converter 20 converting these codes into a series of analog signals at analog output 22. The monotonicity comparator 24 indicates when the analog output 22 is non-monotonic.

The self-test circuit arrangement 10 would be activated, such as automatically upon power up or in response to an external command, from a device (not shown) included in an integrated circuit or externally. For example, a state machine or a microprocessor could switch the self-test circuit into electrical communication with the digital-to-analog converter 20, which may include electrically uncoupling the normal source of digital input 16 and/or the recipient of the analog output 22. Such switching may include having one self-test circuit arrangement 10 switched for a plurality of digital-to-analog converters 20 or one self-test circuit arrangement 10 for each digital-to-analog converter 20.

In applications including a microprocessor, the digital code generator 12 may be one of the functions of the microprocessor. Consequently, a routine which initiates and monitors self-test of the digital-to-analog converter 20 may advantageously include generating each digital input code 14. In other applications where a microprocessor is not present or is otherwise not utilized for the digital code generator 12, a dedicated device would be employed.

Figure 2:
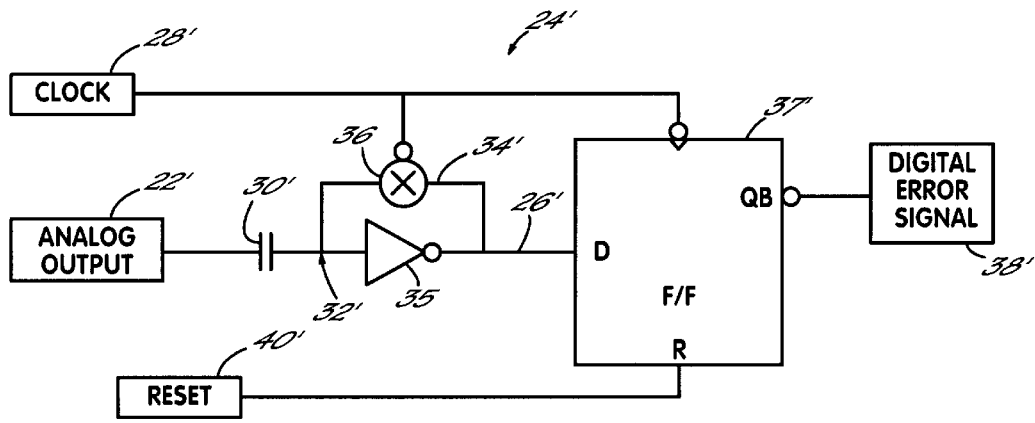
FIG. 2 is a block diagram of a first implementation of the monotonicity comparator referenced in FIG. 1.

Referring to FIG. 2, a first monotonicity comparator 24', specifically a one-stage sample-and-hold circuit, is shown in block diagram form as one example of monotonicity comparator 24 referenced in FIG. 1. An analog output 22' from a digital-to-analog converter (not shown) passes through an input capacitor 30' to the input 32' of a signal amplifier 34', such as a simple logic inverter 35 with a feedback switch 36 controlled by clock 28', although it will be appreciated that other, perhaps more sophisticated, amplifiers may be used. The amount of offset voltage of the monotonicity comparator 24' should be much smaller than the LSB step in the analog output.

The monotonicity comparator 24 operates by first sampling during a negative clock signal of clock 28' when the digital-to-analog converter 20 is generating a first analog signal responsive to a first digital input code. The monotonicity comparator 24 then compares during a positive clock signal 28' when the digital-to-analog converter 20 is generating a second analog signal responsive to a second digital input code.

Thus, as each digital input 16 is converted by the digital-to-analog converter 20, the analog output 22' is sampled before and after the digital-to-analog converter 20 transitions to the next digital input code 14. A sensed non-monotonic transition (i.e., a decreased analog output 22' in the case of a monotone increasing digital input code and a positive voltage reference) is then output as an error signal 26'. Advantageously, a momentary error signal 26' may be retained, such as at the output switch 37', specifically a digital flip-flop, so that a digital error signal 38' may be retained until convenient. The digital error signal 38' may include a human detectable indication such as a light or audio signal and/or a further control function such as disabling the integrated circuit, or a portion thereof, to prevent an erroneous output. A clock 28' synchronizes operation of the signal amplifier 34' and the output switch 37'.

Figure 3:
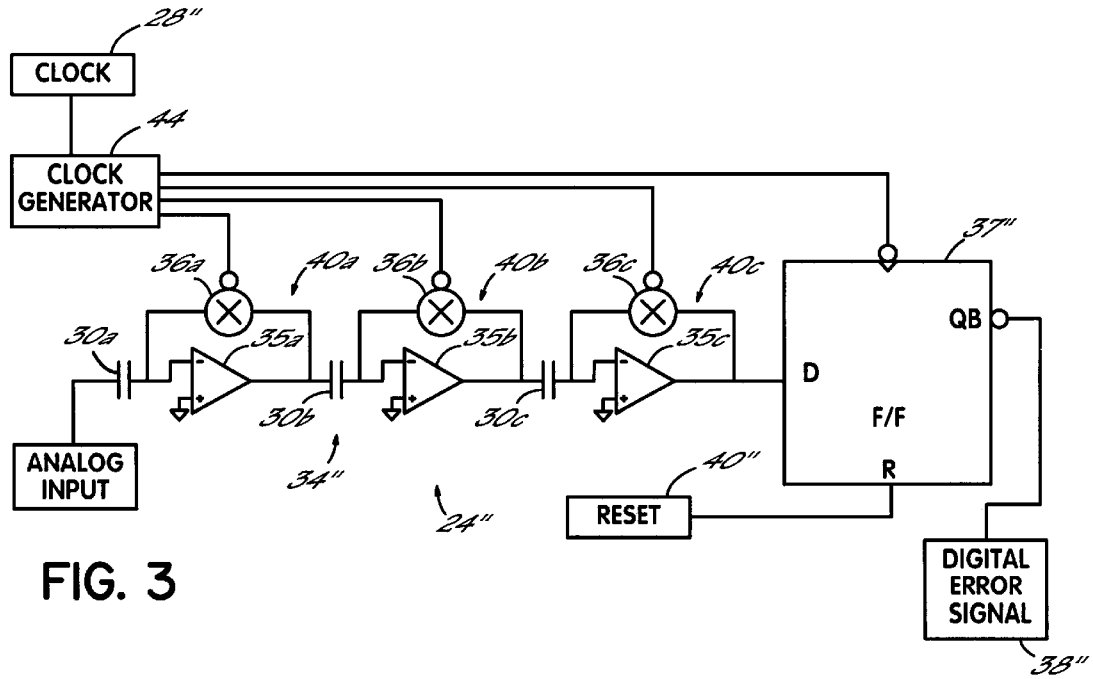
FIG. 3 is a block diagram of a second implementation of the monotonicity comparator referenced in FIG. 1, including a multistage sample and hold circuit arrangement and an output switch.

Referring to FIG. 3, a second monotonicity comparator 24" is shown in block diagram form with a cascaded multistage signal amplifier 34". Such a monotonicity comparator 24" may advantageously provide more gain, greater speed, and reduced offset voltage. The discussion for FIG. 2 applies to FIG. 3 with the following additions. First, each of the three signal amplifier stages 40a–40c utilizes a differential operational amplifier 35a–35c, feedback switches 36a–36c, and input capacitors 30a–30c, respectively. Also, a clock generator 44 receives the clock signal from clock 28". The clock generator 44 sequences each stage 40a–40c of the cascaded multistage signal amplifier 34" and an output switch 37", as would be apparent to those skilled in the art. A similar reset signal 40" resets output switch 37" to clear the digital error signal 38".

Figure 4:
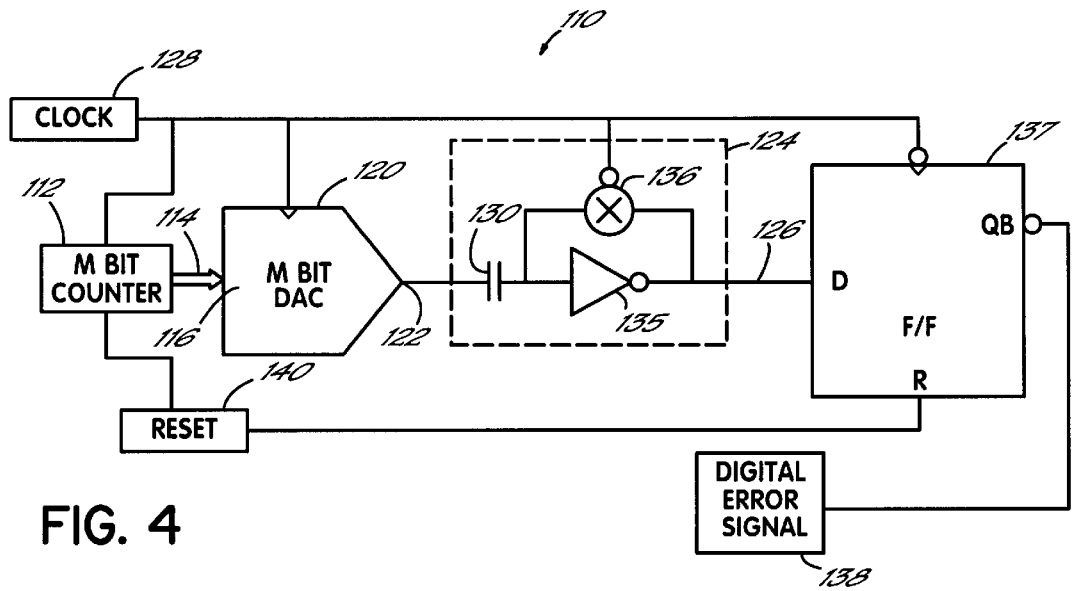
FIG. 4 is a block diagram of a second self-test circuit arrangement consistent with the invention.

Referring to FIG. 4, a second self-test circuit arrangement 110 includes an M-bit counter 112 generating an M-bit digital input code 114 to the digital input 116 of an M-bit digital-to-analog converter 120. The analog output 122 passes through an input capacitor 130 of the monotonicity comparator 124, which in turn outputs an error signal 126 which is latched at an output switch 137 to provide a digital error signal 138. Self-test circuit arrangement 110 further includes a clock 128 operatively coupled to M-bit counter 112, M-bit digital-to-analog converter 120, monotonicity comparator 124, and output switch 137 to synchronize operation. A reset signal 140 resets M-bit counter 112 to the first digital input code in the sequence and resets the output switch 137. The output switch 137 is shown as advantageously inverting its digital error signal 138, and thus a change from "1" to "0" denotes a nonfunctional digital-to-analog converter 120. Thus, a positive confirmation (i.e., a high signal) is provided of functionality.

Figure 5:
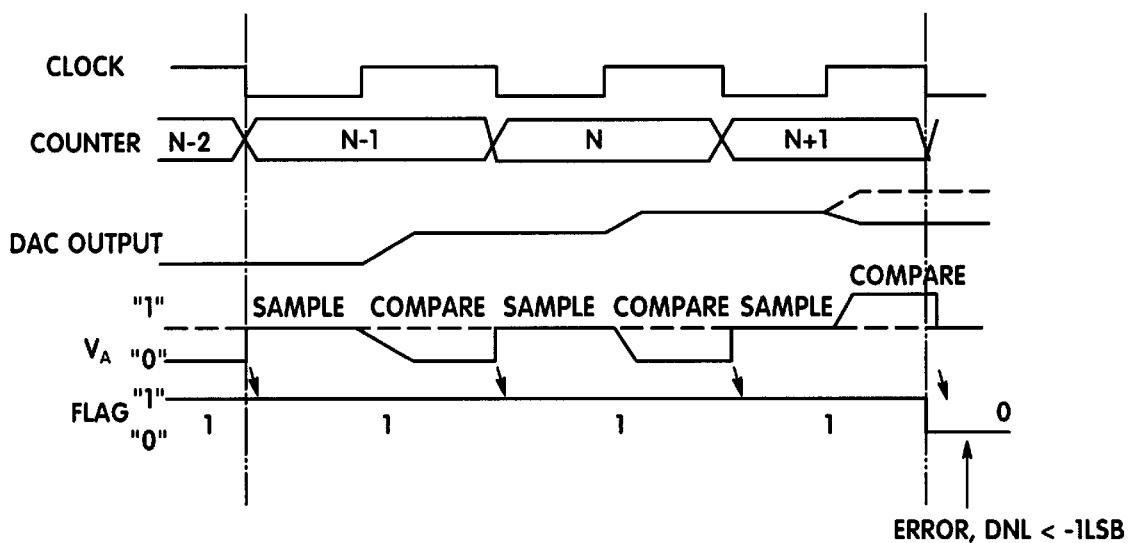
FIG. 5 is a timing diagram for the self-test circuit arrangement of FIG. 4 illustrating a digital input, an analog output, and an error signal indicating a non-monotonic transition.

Referring to FIG. 5, a timing diagram is shown for the second self-test circuit arrangement 110 of FIG. 4. A "clock" signal 128 with a 50% duty cycle synchronizes operation, with each "Off" half-cycle defining the lower half of the transition cycle and each "On" half-cycle defining the upper half of the transition cycle. Thus, at the first falling edge of the first "Off" half-cycle of the clock, the "counter" output signal of counter 112 transitions to the next digital input code in the sequence, denoted as changing from code N–2 to code N–1. The digital-to-analog converter 120 is synchronized by the rising edge of the clock signal at the beginning of the "On" half-cycle to accept a new digital input code. Consequently, the "DAC Output" signal changes to a higher level midway through the code N–1 of the counter. During the "Off" half-cycle of the clock (i.e., lower half of the transition cycle), the monotonicity comparator 124 samples the analog output, which corresponds to the preceding digital input code, in this instance N–2. After the rising edge of the "On" half-cycle of the clock (i.e., upper half of the transition cycle), the monotonicity comparator 124 compares the analog output, corresponding to the current digital input code N–1 to that for the preceding code N–2, generating the error signal 126 ("Va").

At the beginning of the next lower half of the transition cycle, the digital error signal 138 remains high ("1") since a monotonic transition was detected. The same sequence occurs for the second transition cycle of the clock corresponding to the counter generating code N.

The third cycle shown for digital input code N+1 from the counter 112 illustrates a non-monotonic transition. At the midway point (i.e., rising edge of clock) when the digital-to-analog converter 120 transitions to the new code N+1, the digital-to-analog converter output goes down rather than to the correct higher level as shown by the dashed line. Thus, the error signal 126 goes in the opposite direction during the upper half of the transition cycle when comparing the digital-to-analog converter output for code N+1 to preceding code N. Thus, at the next falling edge of the clock, the digital error signal 138 goes low ("0") to denote a non-monotonic transition.

Various additional modifications may be made to the illustrated embodiments without departing from the spirit and scope of the invention. For example, the digital code generator 12 may generate a sequence of digital input codes beginning with the highest possible code and decrementing. Also, the digital code generator 12 may skip codes, such as implementations wherein higher resolution is ignored. Thus, the counter may generate all codes for the upper bits of interest. The range of digital input codes may be constrained for an application, such as when the digital-to-analog converter 20 is not expected to convert codes greater than or less than some value.

As an additional example, the self-test circuit arrangement 10 may be initiated for only a portion of the sequence of digital input codes, returning to the untested portion of the sequence when next initiated. This capability may be advantageous for devices utilizing a periodic self-test during operation. Moreover, when time allotted to testing is critical, self-testing may further include a higher clock speed than typical for normal operation of the digital-to-analog converter 20.

As another example, for applications such as high resolution digital-to-analog converters and/or electromagnetically noisy operating environments, the method and test circuit arrangement 10 advantageously may include repeatedly testing the digital-to-analog converter 20 with a full or partial input code sequence and noise filtering the results, such as by using a digital counter to digitally average, before flagging a real error. It would be apparent to those skilled in the art that other techniques for adjusting the digital input code sequence and/or filtering the output may be used, such as for efficient noise filtering.

What is claimed is:

1. A test circuit arrangement for testing a digital-to-analog converter having a digital input and an analog output, the test circuit arrangement comprising:
   a digital code generator configured to generate a monotonic sequence of digital input codes that includes first and second digital input codes, the first digital input code preceding the second digital input code in the monotonic sequence, the digital code generator adapted to be operably coupled to the digital input of the digital-to-analog converter; and
   a monotonicity comparator adapted to be operably coupled to the analog output of the digital-to-analog converter, the monotonicity comparator configured to compare a second analog signal output by the digital-to-analog converter responsive to the second digital input code with a first analog signal output by the digital-to-analog converter responsive to the first digital input code, and in response thereto, to indicate a non-monotonic transition between the first analog signal and the second analog signal.

2. The test circuit arrangement of claim 1, wherein the digital code generator comprises a counter.

3. The test circuit arrangement of claim 2, wherein the counter comprises one of a parallel digital output counter and a serial output counter.

4. The test circuit arrangement of claim 2, wherein the counter includes a reset input to reset the counter to a first digital input code in the monotonic sequence of the digital input codes.

5. The test circuit arrangement of claim 1, wherein the monotonic sequence comprises a consecutive sequence.

6. The test circuit arrangement of claim 1, wherein the digital-to-analog converter is configured to receive at the digital input a digital input code within a digital input code range and to convert each digital input code to a corresponding analog signal at the analog output, wherein the monotonic sequence includes the digital input code range of the digital-to-analog converter.

7. The test circuit arrangement of claim 1, wherein the analog output of the digital-to-analog converter is differential, and wherein the monotonicity comparator includes a differential input.

8. The test circuit arrangement of claim 1, wherein the monotonicity comparator comprises a sample and compare circuit and a switch, the sample and compare circuit operably coupled to a control of the switch for outputting an error signal indicating the presence of a non-monotonic transition.

9. The test circuit arrangement of claim 8, wherein the sample and compare circuit includes an inverter including an inverter input adapted for capacitive coupling to the analog output of the digital-to-analog converter, the inverter further including an inverter output operatively coupled to the control of the switch, the test responsive to a clock signal related to a change in state of the digital word generator, the inverter including feedback between the inverter output and inverter input, the feedback switchably controlled by the clock signal.

10. The test circuit arrangement of claim 1, wherein the test circuit arrangement comprises an integrated circuit.

11. An integrated circuit including a digital-to-analog converter and a self-test circuit arrangement, the digital-to-analog converter including a digital input and an analog output, the self-test circuit arrangement comprising:
    a digital code generator configured to generate a monotonic sequence of digital input codes that includes first and second digital input codes, the first digital input code preceding the second digital input code in the monotonic sequence, the digital code generator adapted to be operably coupled to the digital input of the digital-to-analog converter; and
    a monotonicity comparator adapted to be operably coupled to the analog output of the digital-to-analog converter, the monotonicity comparator configured to compare a second analog signal output by the digital-to-analog converter responsive to the second digital input code with a first analog signal output by the digital-to-analog converter responsive to the first digital input code, and in response thereto, to indicate a non-monotonic transition between the first analog signal and the second analog signal.

12. The integrated circuit of claim 11, wherein the code generator comprises a counter.

13. The integrated circuit of claim 12, wherein the counter comprises one of a parallel digital output counter and a serial output counter.

14. The integrated circuit of claim 12, wherein the counter includes a reset input to reset the counter to a first digital input code of the plurality of digital input codes.

15. The integrated circuit of claim 11, wherein the analog output of the digital-to-analog converter is differential, and wherein the monotonicity comparator is differential.

16. The integrated circuit of claim 11, wherein the monotonicity comparator comprises a sample and compare circuit and a switch, the sample and compare circuit operably coupled to a control of the switch for outputting an error signal indicating the presence of a non-monotonic transition.

17. The integrated circuit of claim 16, wherein the sample and compare circuit includes an inverter including an inverter input adapted for capacitive coupling to the analog output of the digital-to-analog converter, the inverter further including an inverter output operatively coupled to the control of the switch, the test circuit further responsive to a clock signal related to a change in state of the digital word generator, the inverter including feedback between the inverter output and inverter input, the feedback switchably controlled by the clock signal.

18. A method for testing a digital-to-analog converter included in an integrated circuit, the digital-to-analog converter including a digital input and an analog output, the method comprising:

generating a monotonic sequence of digital input codes that includes first and second digital input codes, the first digital input code preceding the second digital input code in the monotonic sequence, the digital code generator adapted to be operably coupled to the digital input of the digital-to-analog converter;

comparing a second analog signal output by the digital-to-analog converter responsive to the second digital input code with a first analog signal output by the digital-to-analog converter responsive to the first digital input code; and in response thereto, indicating a non-monotonic transition between the first analog signal and the second analog signal.

19. The method of claim 18, wherein comparing the second analog output with the preceding first analog output for monotonicity includes utilizing a sample and compare circuit operatively coupled to the analog output of the digital-to-analog converter, and wherein generating the error signal in response to the non-monotonic transition includes utilizing a switch operatively controlled by the sample and compare circuit.

* * * * *